United States Patent
Hsu et al.

(10) Patent No.: US 6,706,140 B2
(45) Date of Patent: Mar. 16, 2004

(54) CONTROL SYSTEM FOR IN-SITU FEEDING BACK A POLISH PROFILE

(75) Inventors: Chia-Lin Hsu, Taipei (TW); Shao-Chung Hu, Taipei (TW); Teng-Chun Tsai, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 364 days.

(21) Appl. No.: 09/682,486

(22) Filed: Sep. 7, 2001

(65) Prior Publication Data

US 2003/0051035 A1 Mar. 13, 2003

(51) Int. Cl.[7] ............................................. B24B 49/00
(52) U.S. Cl. ....................................... 156/345.13; 451/8
(58) Field of Search ....................... 156/345.14, 345.15, 156/345.16

(56) References Cited

U.S. PATENT DOCUMENTS 6,074,277 A * 6/2000 Arai .............................. 451/8

* cited by examiner

Primary Examiner—Gregory Mills
Assistant Examiner—Sylvia R. MacArthur
(74) Attorney, Agent, or Firm—Winston Hsu

(57) ABSTRACT

A chemical mechanical polishing (CMP) machine has a polish platen, having at least a first ring-shaped region and a second ring-shaped region. A control system for in-situ feeding back a polish profile of the CMP machine has at least a first sensor and a second sensor, respectively installed in the first and the second ring-shaped regions, and a control unit electrically connected to the first sensor and the second sensor for comparing the polish rates of portions of the wafer over the first and the second ring-shaped regions, respectively, according to signals of the first and the second sensors, and adjusting amounts of a slurry supplied by first and second slurry pump valves, corresponding to the first and second ring-shaped regions, according to a predetermined process, or adjusting forces loaded to the first and second regions of the wafer according to the predetermined process.

18 Claims, 4 Drawing Sheets

CONTROL SYSTEM FOR IN-SITU FEEDING BACK A POLISH PROFILE

BACKGROUND OF INVENTION

1. Field of the Invention

The present invention relates to a control system used in a chemical mechanical polishing (CMP) process, and more specifically, to a control system for in-situ feeding back a polish profile.

2. Description of the Prior Art

In the semiconductor industry, a chemical mechanical polishing (CMP) process is one of the most common and important planarization tools applied. For example, the CMP process can be used to remove a topographical target of a thin film layer on a semiconductor wafer. The CMP process produces a wafer with both a regular and planar surface, to ensure an acceptable yield rate in following processes. Certain complications are involved in the CMP process, such as properties of the target thin film layer, uniformity of the target thin film surface, composition and pH value of the slurry, composition of the polishing pad, platen rotational speed, head down force, etc. These factors create difficulty in process control of the CMP process.

Multiple methods are available for determining an endpoint of the CMP process, with the simplest being to control polishing time. However, this method does not account for variation among different wafers, and a sufficient thickness of layer is required to prevent over-polishing. As well, a stop layer is often positioned below the target thin film layer to prevent over-polishing. The removal rate of the stop layer is usually less than that of the overlying target thin film layer. In other words, the removal rate of the target thin film layer is required to be greater than that of the underlying stop layer. The most common method of determining the endpoint of the CMP process is by optically monitoring the dielectric layer by a photo detector. The data, detected by the photo detector, of the intensity of the reflected light beam undergoes periodic changes during the CMP process. A periodically changing curve is thus obtained. Consequently, the endpoint of the CMP process can be precisely determined by using the periodically changing curve.

However, methods provided in the preceding paragraphs are merely used for determining the endpoint of the CMP process. To improve the uniformity of the wafer and increase the product yield rate, it is necessary to provide a method of in-situ feeding back a polish profile during the CMP process.

SUMMARY OF INVENTION

It is therefore a primary object of the present invention to provide a control system used in a chemical mechanical polishing (CMP) process so as to in-situ feed back a polish profile.

According to the claimed invention, a CMP machine comprises a polish platen, comprising at least a first ring-shaped region and a second ring-shaped region, a polish pad installed on the polish platen, a carrier head, used for holding a wafer and comprising an inner portion and an outer portion respectively corresponding to the first ring-shaped region and the second ring-shaped region, positioned over the polish pad, and a slurry supply device, comprising a first slurry pump valve positioned corresponding to the first ring-shaped region, and a second slurry pump valve positioned corresponding to the second ring-shaped region. A control system for in-situ feeding back a polish profile of the CMP machine comprises a control unit and at least a first sensor and a second sensor. The first and the second sensor are installed in the first and second ring-shaped regions, respectively. The control unit is electrically connected to the first sensor and the second sensor for comparing the polish rate of the wafer over the first ring-shaped region and the polish rate of the wafer over the second ring-shaped region according to signals of the first sensor and the second sensor, and adjusting the amounts of the slurry supplied by the first slurry pump valve and supplied by the second slurry pump valve according to a predetermined process, or adjusting the force loaded by the inner portion of the carrier head and loaded by the outer portion of the carrier head according to the predetermined process.

It is an advantage of the present invention against the prior art that the first sensor and the second sensor are employed to transfer signals of thicknesses of a thin film on portions of the wafer respectively corresponding to the first and the second ring-shaped regions, or those of surface temperatures of portions of the wafer respectively corresponding to the first and the second ring-shaped regions, to the control unit during the CMP process. After calculating the polish rates of the wafer over the first and the second ring-shaped regions, the control unit adjusts the amounts of the slurry supplied by the first and the second slurry pump valves, the forces loaded by the inner and the outer portions of the carrier head, or the heights of the polish platen over the first and the second ring-shaped regions so as to in-situ compensate the polish profile of the wafer. Polishing errors are thus immediately corrected during the CMP process. Consequently, both the uniformity and the yield rate of the product are significantly improved.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
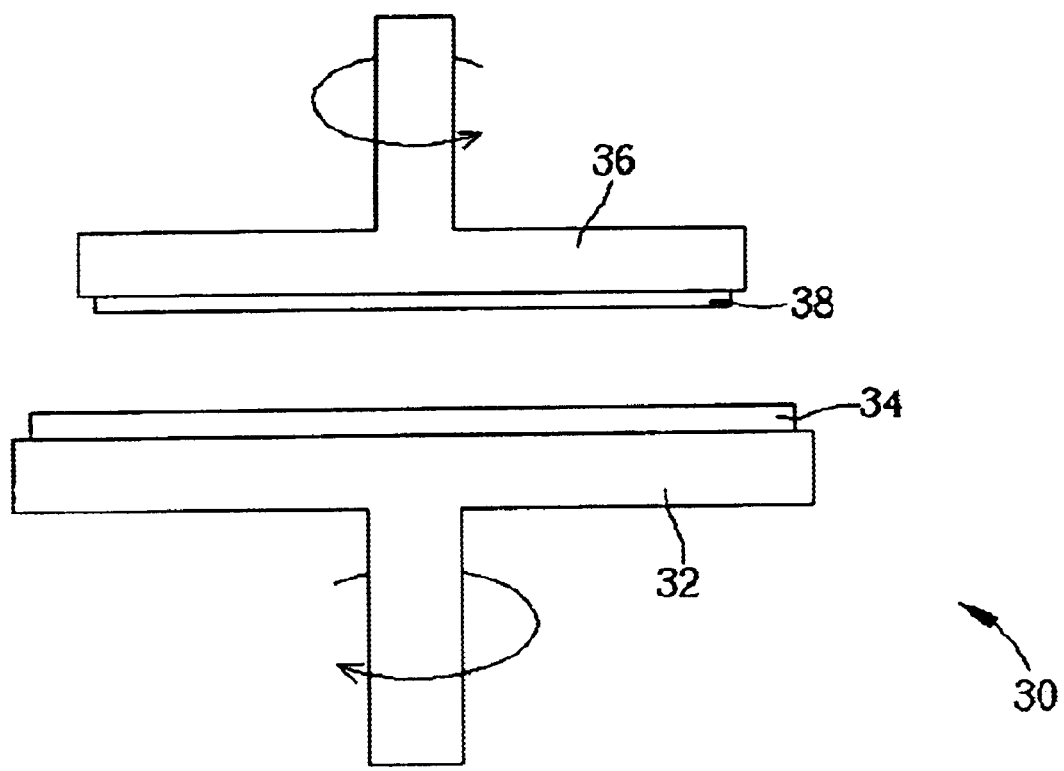
FIG. 1 to FIG. 4 are schematic diagrams of a control system for in-situ feeding back a polish profile during a CMP process according to the present invention.

Please refer to FIG. 1 to FIG. 4 of schematic diagrams of a control system for in-situ feeding back a polish profile during a chemical mechanical polishing (CMP) process according to the present invention. As shown in FIG. 1, a CMP machine 30 comprises a polish platen 32, a polish pad 34 installed on the polish platen 32, a carrier head 36 positioned over the polish pad 34 for holding a wafer 38 and a slurry supply device 40(not shown in FIG. 1).

Figure 2:
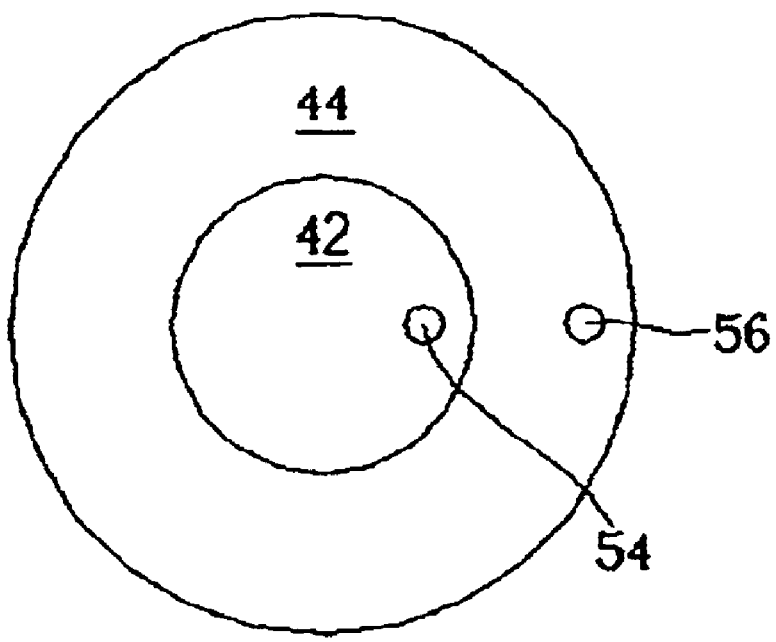
Figure 3:
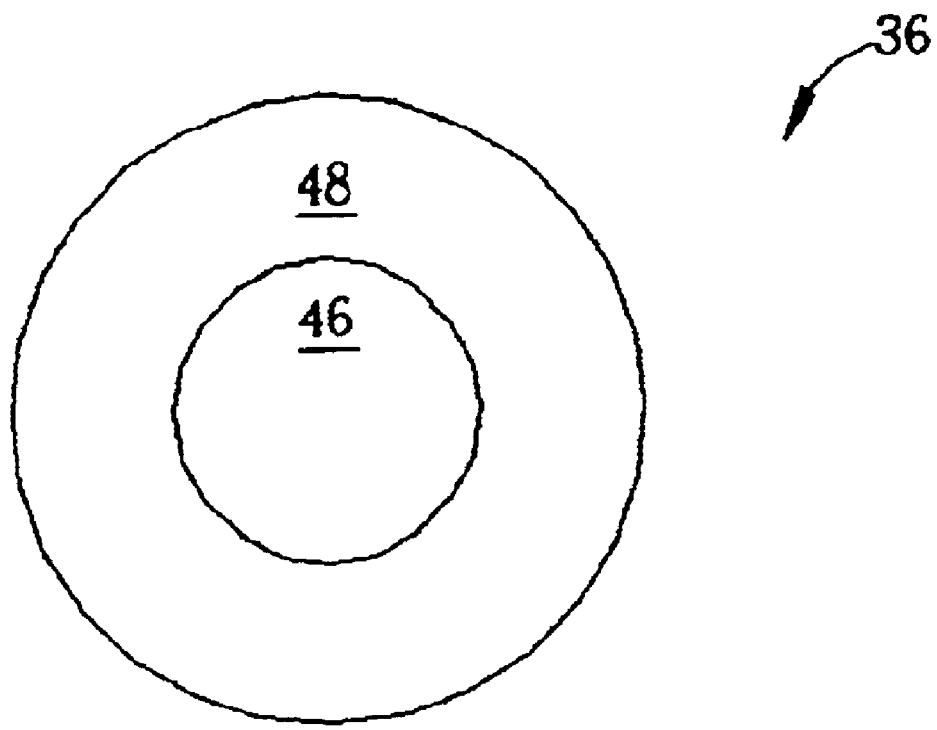
Figure 4:
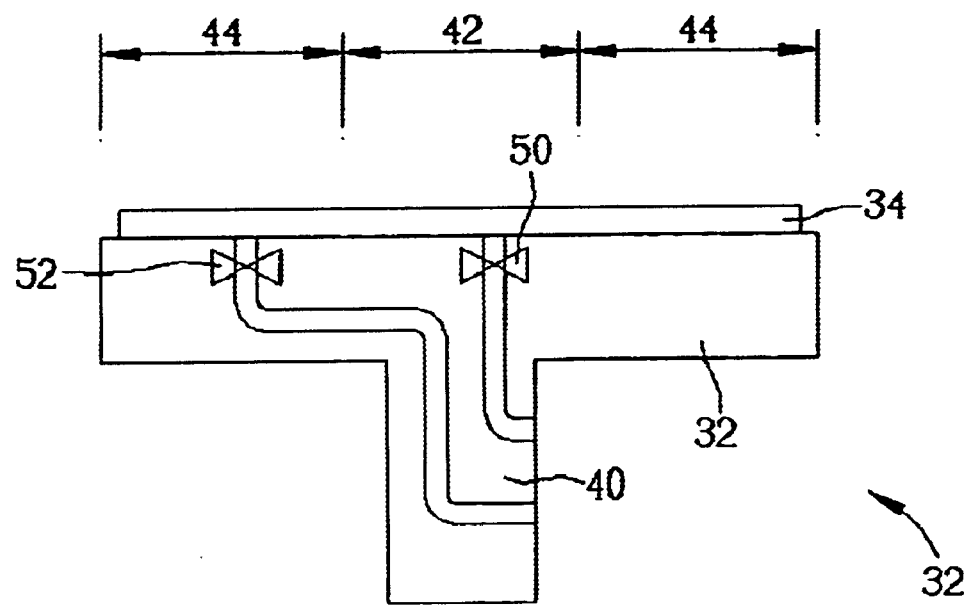

Please refer to FIG. 2, a top view of the polish platen 32, and FIG. 3, a bottom view of the carrier head 36. As shown in FIG. 2, the polish platen 32 comprises at least a first ring-shaped region 42 and a second ring-shaped region 44. A first sensor 54 and a second sensor 56 are installed in the first ring-shaped region 42 and the second ring-shaped region 44, respectively. As shown in FIG. 3, the carrier head 36 comprises at least an inner portion 46 and an outer portion 48 corresponding to the first ring-shaped region 42 and the second ring-shaped region 44, respectively. Please refer to FIG. 4 of a cross-sectional view of the polish platen 32. As shown in FIG. 4, the slurry supply device 40 is positioned inside the polish platen 32 and comprises a first slurry pump valve 50 positioned corresponding to the first ring-shaped region 42, and a second slurry pump valve 52 positioned corresponding to the second ring-shaped region, 44.

The control system provided in the present invention for in-situ feeding back a polish profile during the CMP process comprises at least the first sensor 54 and a second sensor 56, both shown in FIG. 2, and a control unit (not shown) electrically connected to the first sensor 54 and the second sensor 56. The first sensor 54 and the second sensor 56 are both thermal couples employed to transfer signals of surface temperatures of portions of the wafer 38 corresponding to the first ring-shape region 42 and the second ring-shaped region 44, respectively, to the control unit during the CMP process. After calculating the polish rates of the wafer 38 over the first ring-shape region 42 and the second ring-shaped region 44 by comparing the temperature difference of the first ring-shape region 42 and the second ring-shaped region 44 according to the signals transferred by the first sensor 54 and the second sensor 56, the control unit adjusts the amounts of the slurry supplied by the first slurry pump valve 50 and supplied by the second slurry pump valve 52, or adjusts the forces loaded by the inner portion 46 of the carrier head 36 and loaded by the outer portion 48 of the carrier head 36 so as to in-situ compensate the polish profile of the wafer 38. Alternatively the first sensor 54 and the second sensor 56 are both IR sensors.

In another embodiment of the present invention, the first sensor 54 and the second sensor 56 are both optical sensors employed to transfer signals of thicknesses of a thin film on portions of the wafer 38 corresponding to the first ring-shape region 42 and the second ring-shaped region 44, respectively, to the control unit during the CMP process. After calculating the polish rates of the wafer 38 over the first ring-shape region 42 and the second ring-shaped region 44 by comparing the thickness difference of the first ring-shape region 42 and the second ring-shaped region 44 according to the signals transferred by the first sensor 54 and the second sensor 56, the control unit adjusts the amounts of the slurry supplied by the first slurry pump valve 50 and supplied by the second slurry pump valve 52, or adjusts the forces loaded by the inner portion 46 of the carrier head 36 and loaded by the outer portion 48 of the carrier head 36 so as to in-situ compensate the polish profile of the wafer 38.

In another embodiment of the present invention, the first sensor 54 and the second sensor 56 are both thermal couples employed to transfer signals of surface temperatures of portions of the wafer 38 corresponding to the first ring-shaped region 42 and the second ring-shaped region 44, respectively, to the control unit during the CMP process. After calculating the polish rates of the wafer 38 over the first ring-shaped region 42 and the second ring-shaped region 44 by comparing the temperature difference of the first ring-shaped region 42 and the second ring-shaped region 44 according to the signals transferred by the first sensor 54 and the second sensor 56, the control unit adjusts the heights of the polish platen 32 over the first ring-shaped region 42 and the second ring-shaped region 43 so as to in-situ compensate the polish profile of the wafer 38. Alternatively the first sensor 54 and the second sensor 56 are both IR sensors.

In another embodiment of the present invention, the first sensor 54 and the second sensor 56 are both optical sensors employed to transfer signals of thicknesses of a thin film on portions of the wafer 38 corresponding to the first ring-shape region 42 and the second ring-shaped region 44, respectively, to the control unit during the CMP process. After calculating the polish rates of the wafer 38 over the first ring-shaped region 42 and the second ring-shaped region 44 by comparing the thickness difference of the first ring-shaped region 42 and the second ring-shaped region 44 according to the signals transferred by the first sensor 54 and the second sensor 56, the control unit adjusts the heights of the polish platen 32 over the first ring-shaped region 42 and the second ring-shaped region 43 so as to in-situ compensate the polish profile of the wafer 38.

The control system revealed in the embodiments in preceding paragraphs is applicable in both a single wafer CMP machine and a multi-wafer CMP machine. In the production of products with a stringent standard of polish profile, the polish platen 32 can be sectionalized into more than two ring-shaped regions, each ring-shaped region having a sensor, the carrier head 36 can be compartmentalized into more than two concentric portions, and the slurry supply device 40 can be comprised of more than two slurry pump valves. The operating method is the same as those described in the preceding paragraphs and is neglected for simplicity of description.

In comparison with the prior art, the first sensor 54 and the second sensor 56 are employed to transfer signals of thicknesses of the thin film on portions of the wafer 38 corresponding to the first ring-shaped region 42 and the second ring-shaped region 44, respectively, or those of surface temperatures of portions of the wafer 38 corresponding to the first ring-shaped region 42 and the second ring-shaped region 44, respectively, to the control unit during the CMP process. After calculating the polish rates of the wafer 38 over the first ring-shaped region 42 and the second ring-shaped region 44, the control unit adjusts the amounts of the slurry supplied by the first slurry pump valve 50 and supplied by the second slurry pump valve 52, the forces loaded by the inner portion 46 of the carrier head 36 and loaded by the outer portion 48 of the carrier head 36, or the heights of the polish platen 32 over the first ring-shaped region 42 and the second ring-shaped region 43 so as to in-situ compensate the polish profile of the wafer 38. Polishing errors are thus immediately corrected during the CMP process. Consequently, both the uniformity and the yield rate of the product are significantly improved. In addition, the control system is applicable in both a single wafer CMP machine and a multi-wafer CMP machine, and can more precisely control the polish profile of wafers with bigger dimensions by sectionalizing the polish platen into more than two ring-shaped regions, each ring-shaped region having a sensor, compartmentalizing the carrier head 36 into more than two concentric portions, and utilizing the slurry supply device comprised of more than two slurry pump valves during the CMP process in production of products with a stringent standard of polish profile.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A control system for in-situ feeding back a polish profile of a chemical mechanical polishing (CMP) machine, the CMP machine comprising a polish platen, the polish platen comprising at least a first ring-shaped region and a second ring-shaped region, a polish pad installed on the polish platen, a carrier head for holding a wafer positioned over the polish pad, the carrier head at least comprising an inner portion and an outer portion corresponding to the first ring-shaped region and the second ring-shaped region, respectively, and a slurry supply device, the slurry supply device comprising a first slurry pump valve positioned corresponding to the first ring-shaped region, and a second slurry pump valve positioned corresponding to the second ring-shaped region, the control system comprising:

at least a first sensor and a second sensor, installed in the first ring-shaped region and the second ring-shaped region, respectively; and a control unit electrically connected to the first sensor and the second sensor for comparing the polish rate of the wafer over the first ring-shaped region and the polish rate of the wafer over the second ring-shaped region according to signals of the first sensor and the second sensor, and adjusting the amounts of the slurry supplied by the first slurry pump valve and supplied by the second slurry pump valve according to a predetermined process, or adjusting the force loaded by the inner portion of the carrier head and loaded by the outer portion of the carrier head according to the predetermined process.

2. The control system of claim 1 whereinthe control system is used in a single wafer CMP machine, or used in a multi-wafer CMP machine.

3. The control system of claim 1 whereinthe first sensor and the second sensor are both thermal couples, or are both infrared (IR) sensors.

4. The control system of claim 3 whereinthe signals transferred by the first sensor and the second sensor are surface temperatures of the wafer, and the predetermined process adjusts the amounts of the slurry supplied by the first slurry pump valve and supplied by the second slurry pump valve, or adjusts the force loaded by the inner portion of the carrier head and loaded by the outer portion of the carrier head according to a difference of the surface temperatures of the wafer.

5. The control system of claim 1 whereinthe first sensor and the second sensor are both optical sensors.

6. The control system of claim 5 whereinthe signals transferred by the first sensor and the second sensor are thicknesses of a thin film on the wafer, and the predetermined process adjusts the amounts of the slurry supplied by the first slurry pump valve and supplied by the second slurry pump valve, or adjusts the force loaded by the inner portion of the carrier head and loaded by the outer portion of the carrier head according to a difference of the thicknesses of the thin film.

7. A control system for in-situ feeding back a polish profile of a chemical mechanical polishing (CMP) machine, the CMP machine comprising a polish platen, the polish platen comprising at least a first ring-shaped region and a second ring-shaped region, a polish pad installed on the polish platen, a carrier head for holding a wafer positioned over the polish pad, and a slurry supply device, the slurry supply device comprising a first slurry pump valve positioned corresponding to the first ring-shaped region, and a second slurry pump valve positioned corresponding to the second ring-shaped region, the control system comprising:

at least a first sensor and a second sensor, installed in the first ring-shaped region and the second ring-shaped region, respectively; and a control unit electrically connected to the first sensor and the second sensor for comparing the polish rate of the wafer over the first ring-shaped region and the polish rate of the wafer over the second ring-shaped region according to signals of the first sensor and the second sensor, respectively, and adjusting amounts of the slurry supplied by the first slurry pump valve and supplied by the second slurry pump valve according to a predetermined process.

8. The control system of claim 7 whereinthe control system is used in a single wafer CMP machine, or used in a multi-wafer CMP machine.

9. The control system of claim 7 whereinthe first sensor and the second sensor are both thermal couples, or are both infrared (IR) sensors.

10. The control system of claim 9 whereinthe signals transferred by the first sensor and the second sensor are surface temperatures of the wafer, and the predetermined process adjusts the amounts of the slurry supplied by the first slurry pump valve and supplied by the second slurry pump valve according to a difference of the surface temperatures of the wafer.

11. The control system of claim 7 whereinthe first sensor and the second sensor are both optical sensors.

12. The control system of claim 11 whereinthe signals transferred by the first sensor and the second sensor are thicknesses of a thin film on the wafer, and the predetermined process adjusts the amounts of the slurry supplied by the first slurry pump valve and supplied by the second slurry pump valve according to a difference of the thicknesses of the thin film.

13. A control system for in-situ feeding back a polish profile of a chemical mechanical polishing (CMP) machine, the CMP machine comprising a polish platen, the polish platen comprising at least a first ring-shaped region and a second ring-shaped region, a polish pad installed on the polish platen, a carrier head for holding a wafer positioned over the polish pad, and a slurry supply device, the control system comprising:

at least a first sensor and a second sensor, installed in the first ring-shaped region and the second ring-shaped region, respectively; and a control unit electrically connected to the first sensor and the second sensor for comparing the polish rate of the wafer over the first ring-shaped region and the polish rate of the wafer over the second ring-shaped region according to signals of the first sensor and the second sensor, and adjusting the heights of the inner portion of the polish platen and the outer portion of the polish platen according to a predetermined process.

14. The control system of claim 13 whereinthe control system is used in a single wafer CMP machine, or used in a multi-wafer CMP machine.

15. The control system of claim 13 whereinthe first sensor and the second sensor are both thermal couples, or are both infrared (IR) sensors.

16. The control system of claim 15 whereinthe signals transferred by the first sensor and the second sensor are surface temperatures of the wafer, and the predetermined process adjusts the heights of the inner portion of the polish platen and the outer portion of the polish platen according to a difference of the surface temperatures of the wafer.

17. The control system of claim 13 whereinthe first sensor and the second sensor are both optical sensors.

18. The control system of claim 17 whereinthe signals transferred by the first sensor and the second sensor are thicknesses of a thin film on the wafer, and the predetermined process adjusts the heights of the inner portion of the polish platen and the outer portion of the polish platen according to a difference of the thicknesses of the thin film.

* * * * *